(12) United States Patent
Hyvönen

(10) Patent No.: US 7,236,065 B2
(45) Date of Patent: Jun. 26, 2007

(54) INTEGRATED RF-FRONT END HAVING AN ADJUSTABLE ANTENNA

(75) Inventor: Lassi Hyvönen, Helsinki (FI)

(73) Assignee: Nokia Corporation, Espoo (FI)

( * ) Notice: Subject to any disclaimer, the term of this patent is extended or adjusted under 35 U.S.C. 154(b) by 59 days.

(21) Appl. No.: 10/833,891

(22) Filed: Apr. 28, 2004

(65) Prior Publication Data

US 2005/0253664 A1 Nov. 17, 2005

(51) Int. Cl.
*H01P 1/10* (2006.01)
*H04B 1/38* (2006.01)

(52) U.S. Cl. ............... 333/101; 333/103; 333/105; 455/74

(58) Field of Classification Search .......... 333/101, 333/246, 103; 343/700 MS, 702; 257/275; 455/74
See application file for complete search history.

(56) References Cited

U.S. PATENT DOCUMENTS

| | | | | |
|---|---|---|---|---|
| 5,043,738 | A * | 8/1991 | Shapiro et al. ...... | 343/700 MS |
| 5,764,189 | A * | 6/1998 | Lohninger ........... | 343/700 MS |
| 6,342,869 | B1 * | 1/2002 | Edvardsson et al. ....... | 343/841 |
| 6,542,050 | B1 * | 4/2003 | Arai et al. .................. | 333/134 |
| 6,815,739 | B2 * | 11/2004 | Huff et al. .................. | 257/275 |
| 6,828,556 | B2 * | 12/2004 | Pobanz et al. ........... | 250/336.1 |

OTHER PUBLICATIONS

R.T. Kuroda et al., Large scale W-band focal plane array developments for passive millimeter wave imaging, Apr. 1998, SPIE conference, pp. 57-62.*
United States Frequency Allocations, Oct. 2003, US Department of Commerce NTIA, 1 page.*
Wikipedia, Radio frequency, Aug. 2006, 4 pages.*

* cited by examiner

*Primary Examiner*—Dean Takaoka
(74) *Attorney, Agent, or Firm*—Ware, Fressola, Van Der Sluys & Adolphson LLP

(57) ABSTRACT

An integrated RF front-end module for use in a communications device, such as a mobile phone. The RF front-end module is made from a laminated structure consisting of a plurality of layers. At least one of the layers is used to embed RF electronics. Microvias are disposed in various layers of the laminated structure so as to provide electrical connections to the embedded RF electronics. Two electrically conductive layers are provided on both sides of the laminated structure for shielding the RF components against electromagnetic interference. An antenna has one or two radiating elements disposed on one or both sides of the laminated structures for conveying RF signals to and from the RF electronics. The antenna can be fine-tuned and the operational frequency range of the antenna can also be changed.

16 Claims, 9 Drawing Sheets

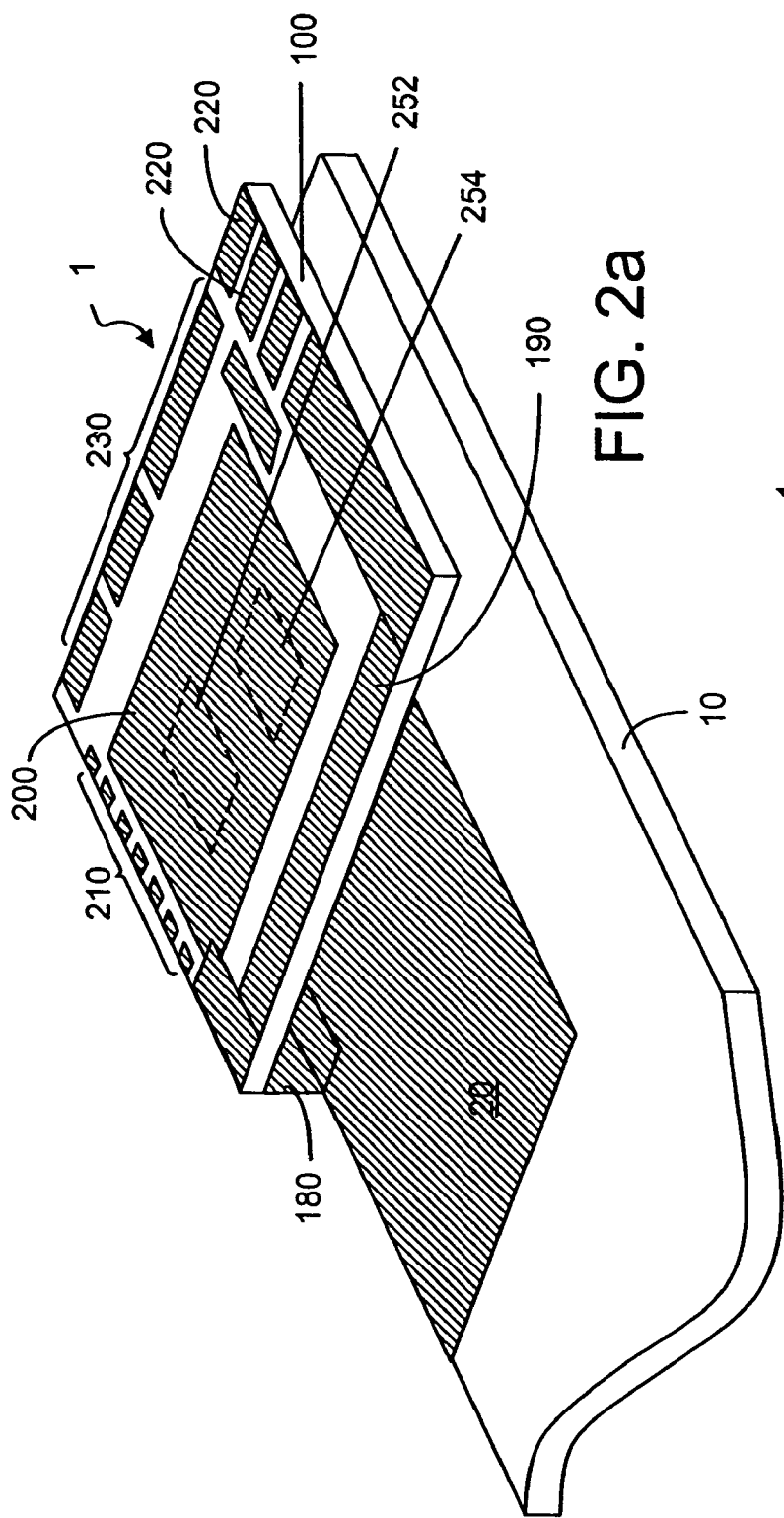
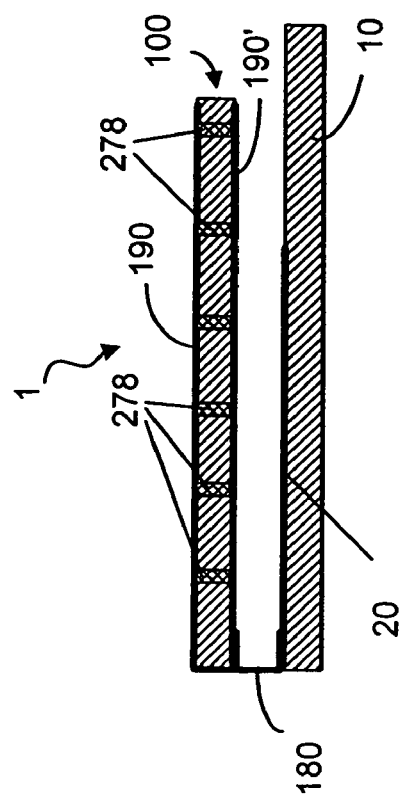

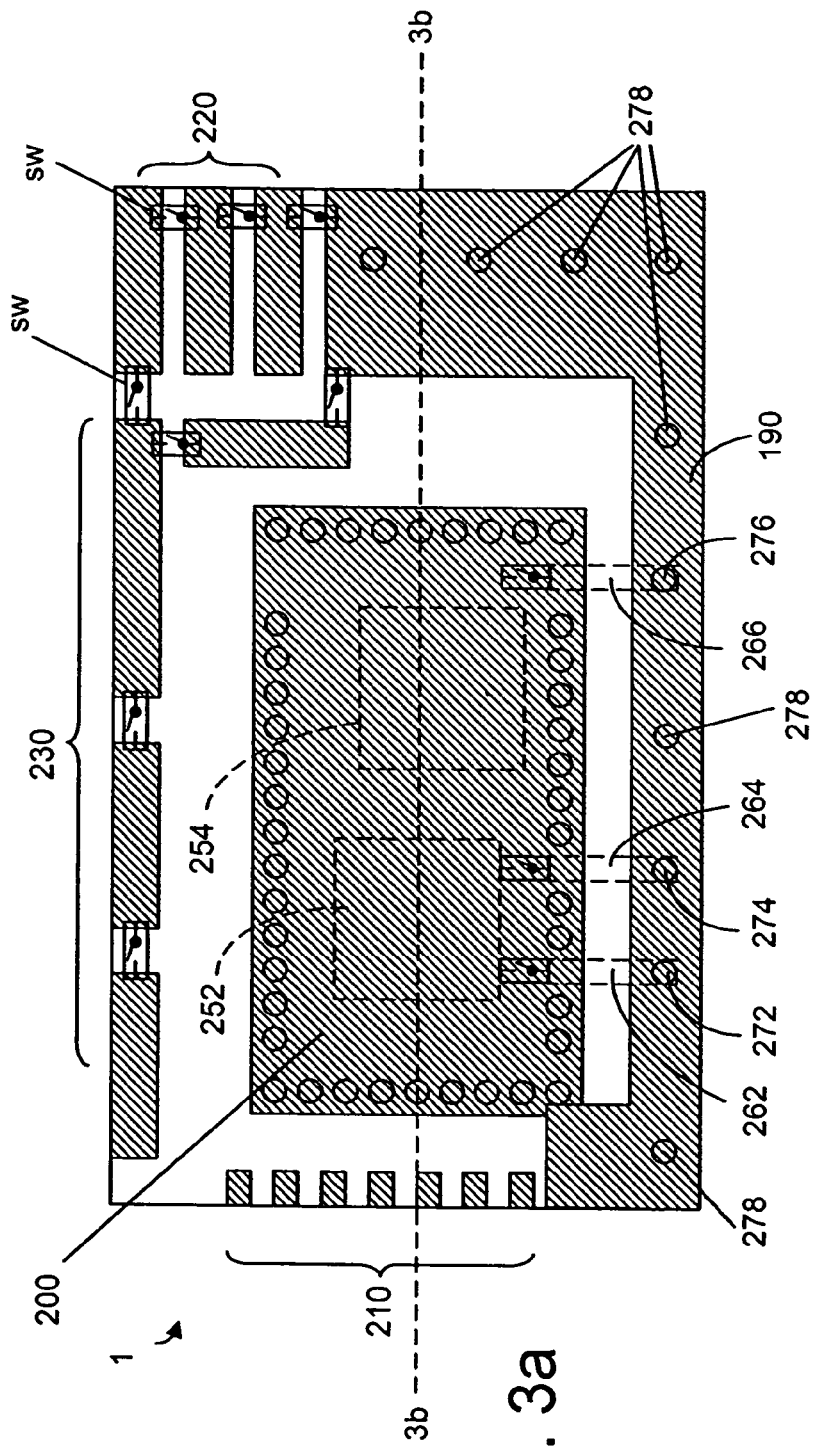
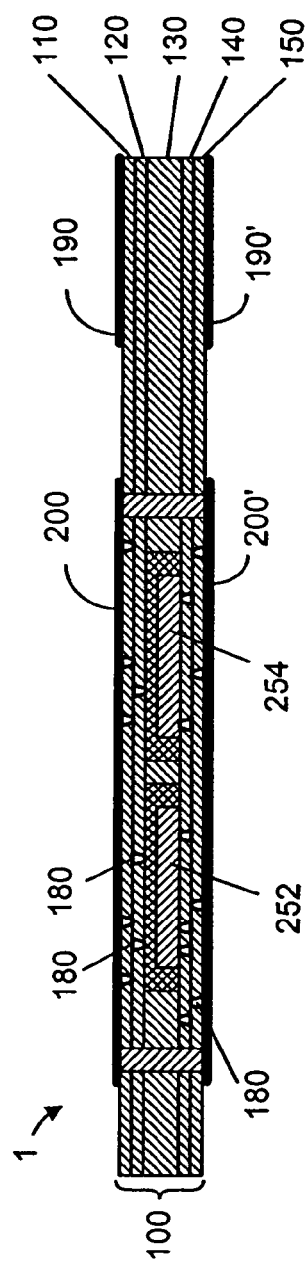
FIG. 3a
FIG. 3b

INTEGRATED RF-FRONT END HAVING AN ADJUSTABLE ANTENNA

CROSS REFERENCES TO RELATED APPLICATIONS

The present application is related to U.S. patent application, Ser. No. 10/833,892 assigned to the assignee of the present application, and filed even date herewith.

FIELD OF THE INVENTION

The present invention generally relates to an antenna for use in an electronic device and, more particularly, to the integration of an antenna with RF electronics.

BACKGROUND OF THE INVENTION

As more and more radio systems are required to be implemented on a portable electronic device, such as a mobile terminal, it becomes difficult to provide a small-sized, multi-resonant antenna with sufficient efficiency for all the required bands.

In prior art, an antenna for the mobile terminal, as shown in FIG. 1, is generally made of a piece of metal as its resonator 512, supported by a piece of plastic 530 or the like so that the antenna can be kept apart from the mother board 510. As shown in FIG. 1, the antenna 500 has a number of electrical contacts 514 connected to the mother board for feeding and grounding purposes. The resonator has a particular shape to provide the required resonance for the multi-band application. Such an antenna is difficult to tune and the switching between bands generally suffers significant loss of RF power and harmonic distortion.

It is thus advantageous and desirable to provide a method to fabricate a small-sized antenna that is easy to tune and for which the switching between bands can be carried out efficiently.

SUMMARY OF THE INVENTION

The present invention integrates an adjustable antenna with RF electronics in an RF front-end module. As such, the antenna and the RF-front-end module are disposed on the same physical carrier. In particular, the physical carrier is a shielded laminated structure, which is used to embed some or all of the RF electronics in an electronic device.

Thus, the first aspect of the present invention provides an integrated RF front-end module for use in an electronic device. The RF front-end module comprises:

a physical carrier having a first surface and an opposing second surface;

an antenna having at least one radiating element disposed on at least one of the first and second surfaces of the physical carrier;

RF electronic components disposed in the physical carrier; and electrically conductive connectors disposed in the physical carrier for providing electrical connections between the antenna and the RF electronic components.

According to the present invention, the physical carrier comprises a laminated structure and wherein the RF components are embedded in the laminated structure and the module further comprises:

at least one electrically conductive layer disposed on the laminated structure substantially over the embedded RF components for shielding the RF components against electromagnetic interference.

The laminated structure comprises a plurality of layers and one or more layers can be printed wire boards.

According to the present invention, the RF front-end module further comprises:

one or more electrically conductive segments disposed on at least one of the first and second surfaces of the physical carrier in relation to said at least one radiating element; and one or more switching elements for selectively connecting said one or more electrically conductive segments and said at least one radiating element for tuning the antenna.

According to the present invention, the antenna has an operational frequency range and the RF front-end module further comprises:

one or more electrically conductive segments disposed on at least one of the first and second surfaces of the physical carrier in relation to said at least one radiating element; and one or more switching elements for selectively connecting said one or more electrically conductive segments and said at least one radiating element for changing the operational frequency range.

The switching elements can be MEM switches, CMOS switches or the like. According to the present invention, the front-end module further comprises a plurality of feed points associated with different locations of the antenna, wherein the feed points are selectable for impedance match tuning. The module further comprises one or more acoustic-wave filters operatively connected to the antenna for synthesizing a frequency response of the antenna, or for preventing harmonic frequencies associated with the antenna from radiating.

The second aspect of the present invention provides a communications device operating in RF frequencies. The communications device comprises:

a housing; and an integrated RF front-end module, the module comprising:

a physical carrier having a first surface and an opposing second surface;

an antenna having at least one radiating element disposed on at least one of the first and second surfaces of the physical carrier;

RF electronic components disposed in the physical carrier; and electrically conductive connectors disposed in the physical carrier for providing electrical connections between the antenna and the RF electronic components.

The communications device can be a mobile terminal, a communicator device or the like.

The present invention will become apparent upon reading the description taken in conjunction with FIGS. 2 to 9b.

BRIEF DESCRIPTION OF THE DRAWINGS

FIG. 2a is a schematic representation illustrating an integrated antenna and RF front-end module disposed on a mother board, according to the present invention.

FIG. 2b is a cross sectional view showing the integrated module in relation to the mother board, according to the present invention.

FIG. 3a is a top view showing the integrated module, according to the present invention.

FIG. 3b is a cross sectional view showing the integrated module, according to the present invention.

DETAILED DESCRIPTIONS OF THE INVENTION

Figure 1:
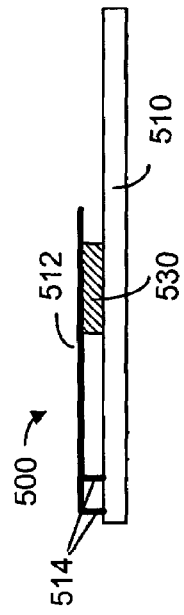
FIG. 1 is a schematic representation illustrating a prior art antenna for use in a portable device.

FIG. 2a is a schematic representation showing the integrated antenna/RF front-end module of the present invention. As shown, the integrated module 1 is disposed in relation to a mother board 10. The integrated module 1 is disposed on a physical carrier 100, attached to the mother board 10. As shown in FIG. 2a, the mother board 10 has a ground plane 20. The antenna comprises an electrically conductive resonator element 190, operatively connected to the ground plane 20 via the ground connection 180. The resonator element 190 is disposed on the surface of the physical carrier 100. In order to facilitate operation mode selection and the tuning of the antenna, a plurality of electrically conductive segments 220 and 230 are also disposed on the surface of the physical carrier 100. It is possible to provide another resonator element 190' on the other surface of the laminated structure 100, as shown in FIG. 2b. The resonator elements 190 and 190' can be integrated into a single resonator unit by a plurality of vias 278 as shown in FIGS. 2b and 3a.

According to the present invention, the physical carrier 100 is a laminated structure (see FIG. 3b) so that some or all of the RF electronic components for use with the antenna can be embedded in the laminated structure. As shown in FIG. 3a, a plurality of electronic chips 252, 254 are embedded in the physical carrier 100. One or both of the chips 252, 254 are RF components to carry out the functions of an RF front-end module. For providing electromagnetic shielding for the chips 252, 254, an electrically conductive layer 200 is disposed on part of the surface of the physical carrier 100. Likewise, another electrically conductive layer 200' is disposed on part of the opposing surface of the physical carrier 100 for shielding purposes (see FIG. 3b). Furthermore, a plurality of connection pads 210 are provided on the integrated module 1 for RF—baseband connections.

The signal connection between the resonator elements 190, 190' and one or more of embedded electronics is provided by a plurality of electrical connectors 272, 274 and 276 and a plurality of feed points 262, 264 and 266. A plurality of vias 278 are provided between the upper and lower layers of the integrated module 1 to electrically connect the resonator elements 190, 190' into a single resonator unit. The feed points 262, 264 and 266 can be selected using the respective switches (SW). The change of the antenna feed points can be used for impedance match tuning. More switches are provided between various electrically conductive segments 220, 230 and the resonator element 190 for frequency tuning and adjustment of the antenna.

Figure 3C:
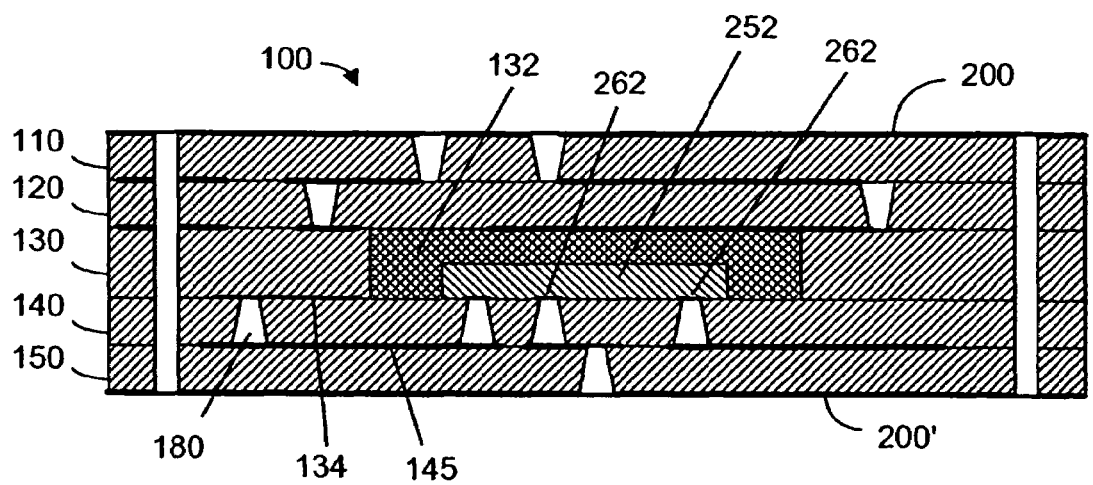
FIG. 3c is a cross sectional view showing a shielded laminated structure having an embedded chip.

A cross sectional view (along the line 3b in FIG. 3a) of the laminated structure of the physical carrier 100 is shown in FIG. 3b. The laminated structure can be made of a plurality of layers 110-150, for example. As shown in FIG. 3b, the core layer 130 is used for embedding the chips 252 and 254. The layers 110-150 can be made from FR4 materials, for example. A typical FR4 board has a dielectric core layer sandwiched between two copper foils. The copper foil can be etched or otherwise patterned to provide electrical connectors on the board surface. The board can also be machined to provide an opening for embedding chips, for example. As shown in FIG. 3c, an opening 132 is made in the core layer 130 for embedding the chip 252 and an epoxy material can be used to fill the opening 132 as a mold in order to secure the chip 252. The electrical connectors 134, 145 between two layers are used to provide electrical connections between the microvias 180, for example. The copper foils on one of the surfaces of the layer 110 and one of the surfaces of the layer 150 are used for shielding the chip 252 against electromagnetic interference and for avoiding EMC (electromagnetic compatibility) related problems. It should be noted that one or more of the layers 110-150 can be PWBs (printed wire boards), or PCBs (printed circuit boards).

Figure 4A:
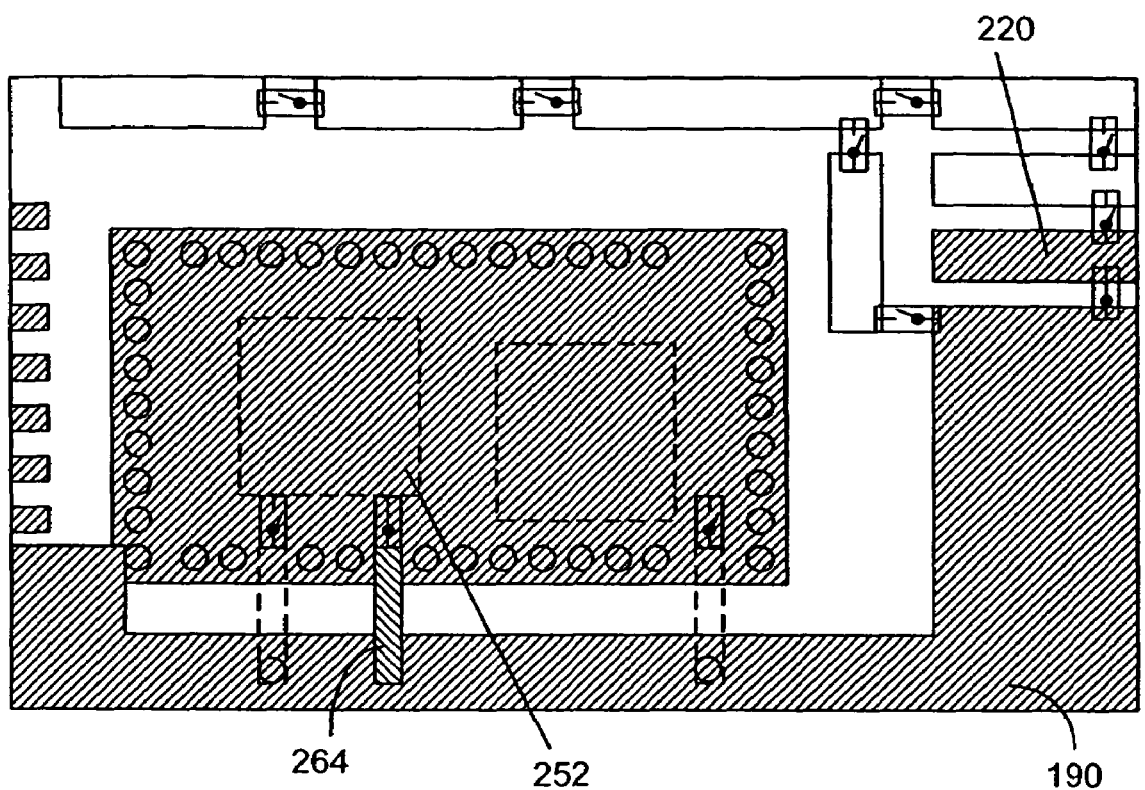
FIGS. 4a to 4c are schematic representations showing how the tuning of the antenna is carried out, according to the present invention.
Figure 4B:
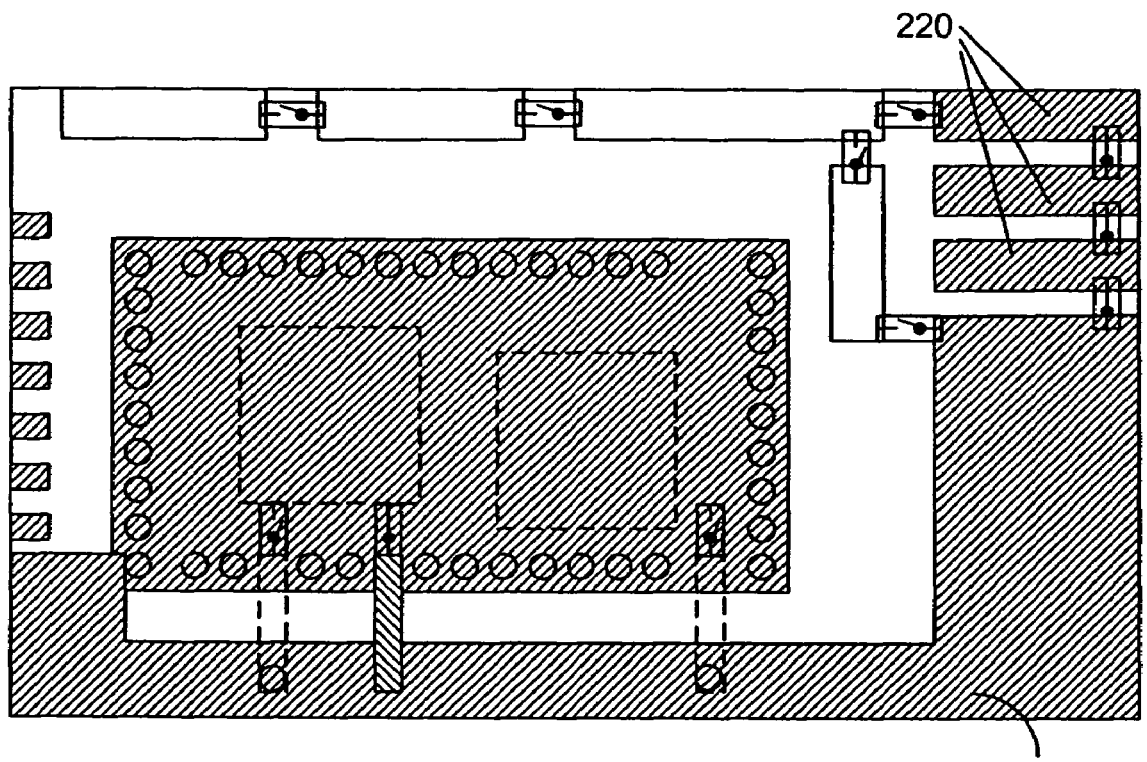
Figure 4C:
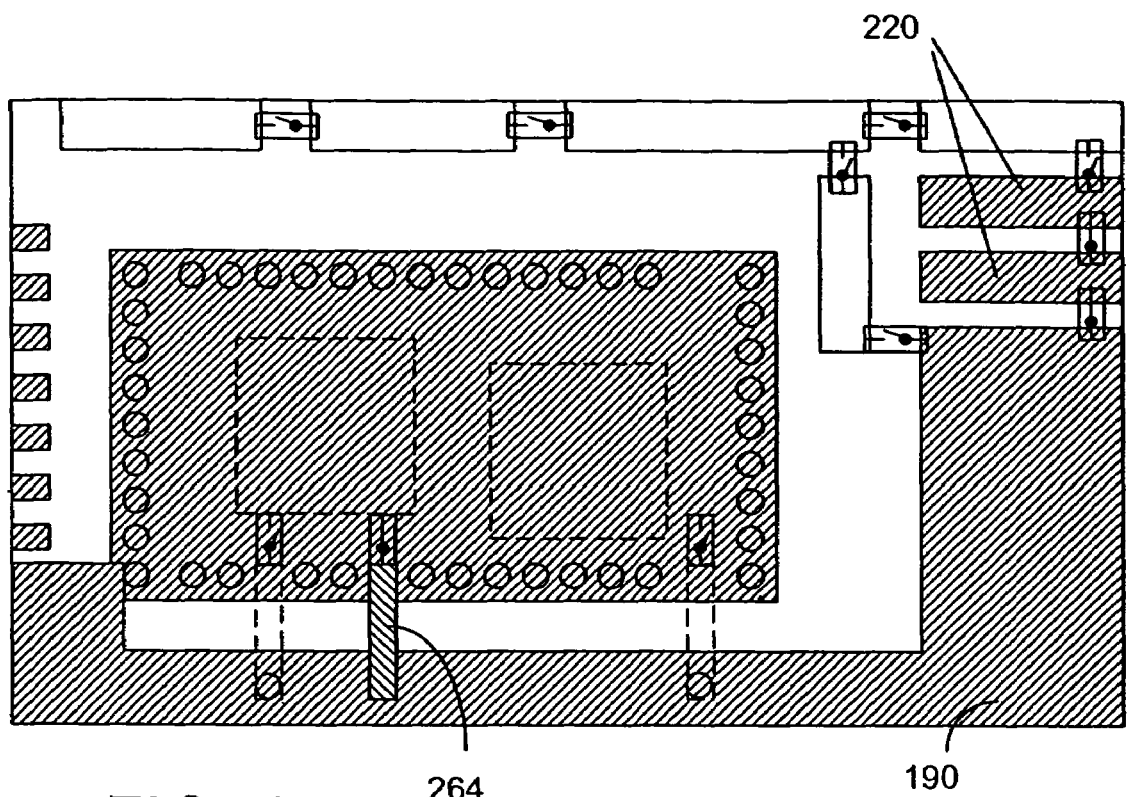

FIGS. 4a-4f show how fine tuning of the antenna and mode selection can be carried out. In FIGS. 4a-4c, different number of electrically conductive segments are operatively connected to the radiator element 190 by one or more switches for fine tuning the antenna. This fine tuning procedure is usually used to compensate for hand-effects, for example, in order to improve the antenna efficiency. Fine tuning can be used for selection between close bands (e.g. European/U.S. GSM bands). Tuning is also used in Tx-Rx band switching in GSM. The connections between the resonator element 190 and the electrically conductive segments 220 do not significantly change the shape of the antenna.

Figure 4D:
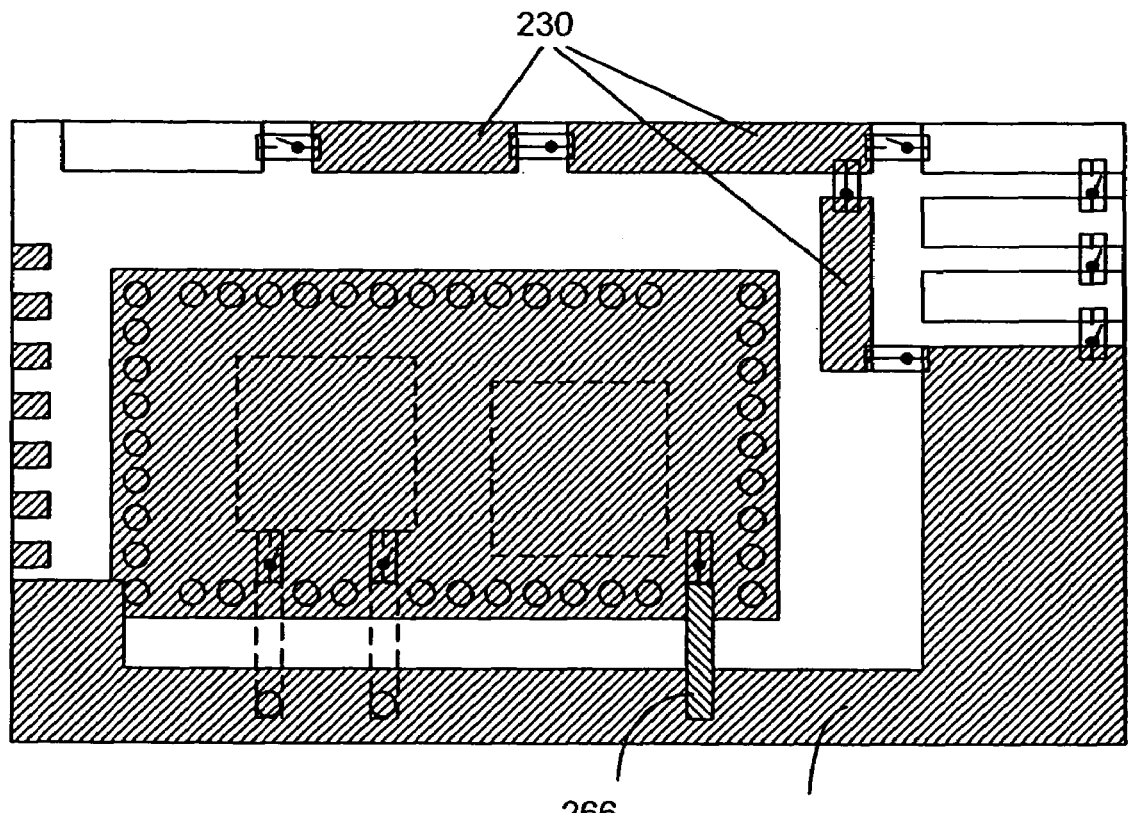
FIG. 4d is a schematic representation showing how mode selection is carried out, according to the present invention.

For operational mode selection between 1GSM and 2GSM, for example, it is usually required changing the shape of the antenna. As shown in FIG. 4d, one or more of the electrically conductive segments 230 are connected to the resonator element 190 in series. The connection effectively extends the antenna to another edge of the physical carrier 100.

Figure 4E:
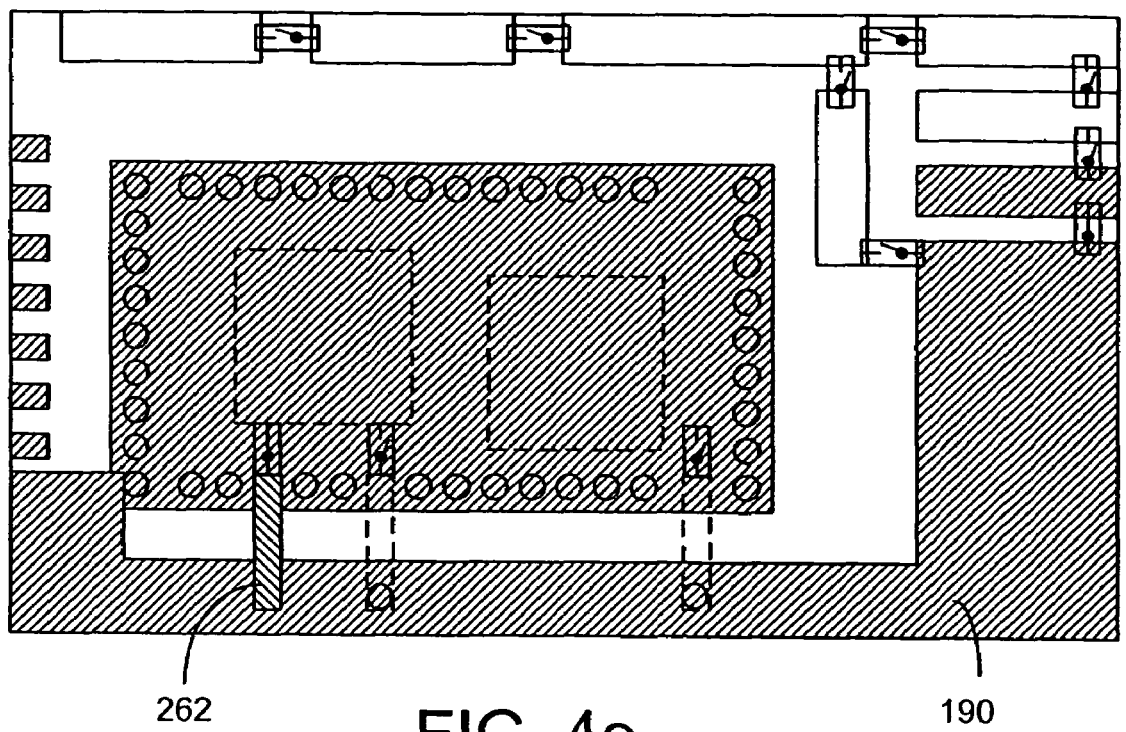
FIGS. 4e and 4f are schematic representations showing how impedance match tuning is carried out, according to the present invention.
Figure 4F:
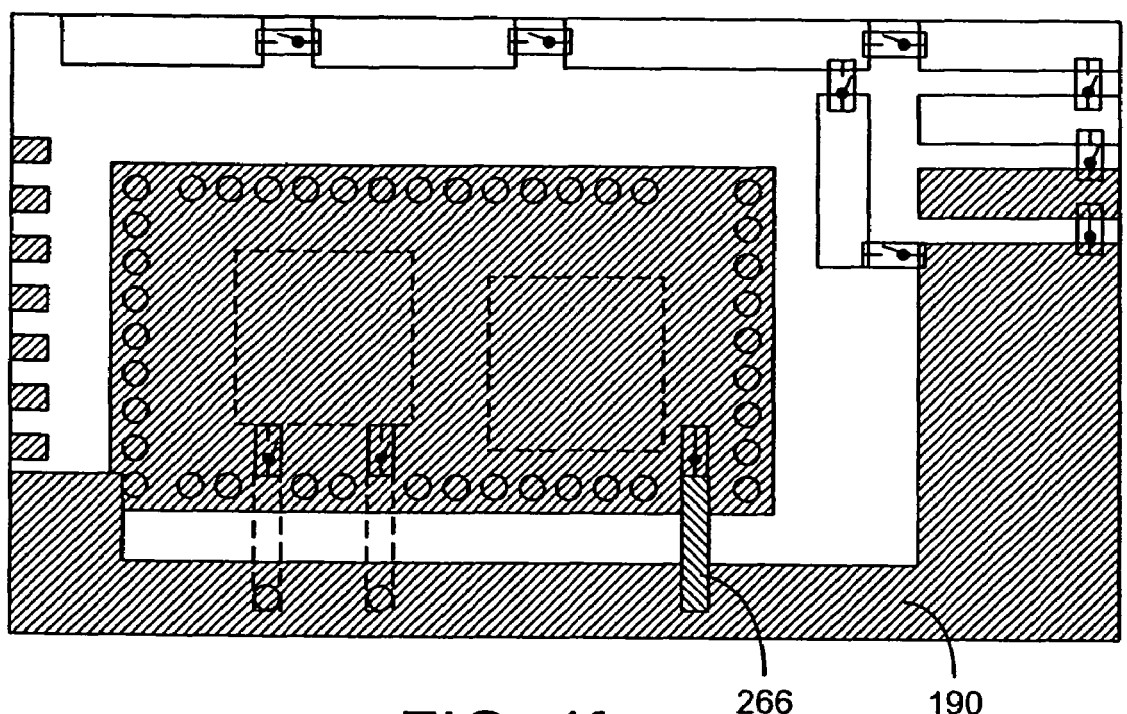

FIGS. 4a, 4e and 4f show how the adjustment of antenna impedance can be carried out. In FIG. 4a, the feed point 264 becomes active by the closing of the switch connecting the feed point 264 to the embedded RF electronics. Likewise, the feed points 262 and 266 can be separately selected, as shown in FIGS. 4e and 4f, respectively. In general, antenna impedance is adjusted when the user's hand loads the antenna, causing the impedance to change due to the capacitance change. Feed point selection can also be used when the power level of the power amplifier (PA, not shown) in a transmit path has changed. Different feed points can be used for different radio systems. For example, the optimum feed point for 1GSM may be different from the optimum feed point for 2GSM.

Figure 5B:
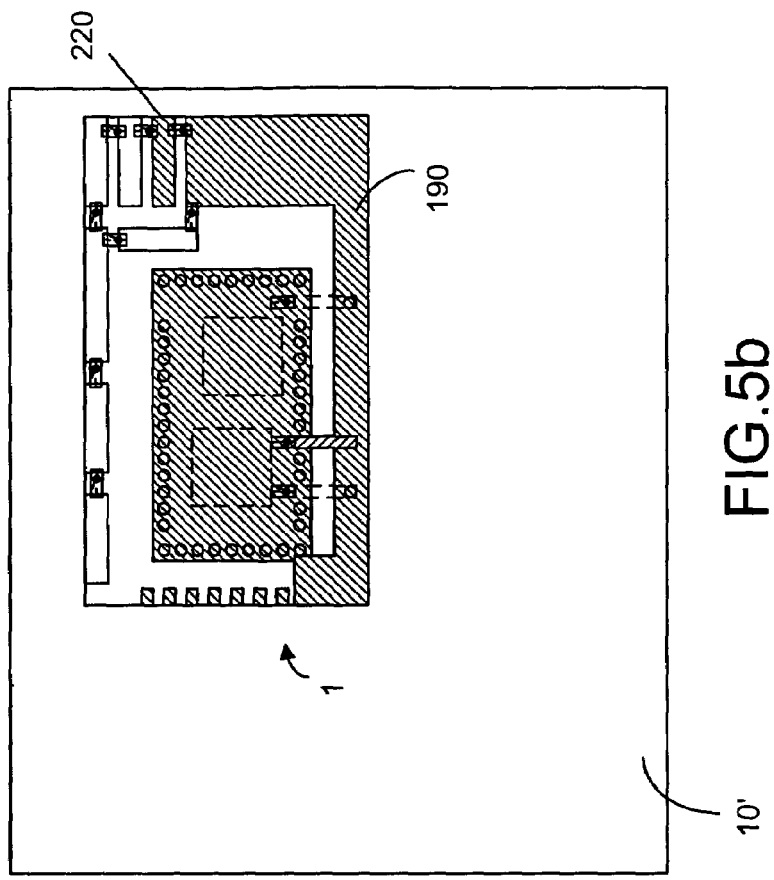
FIGS. 5a and 5b are schematic representations illustrating the adjusting and fine tuning of the integrated module for use in different electronic devices.
Figure 5A:
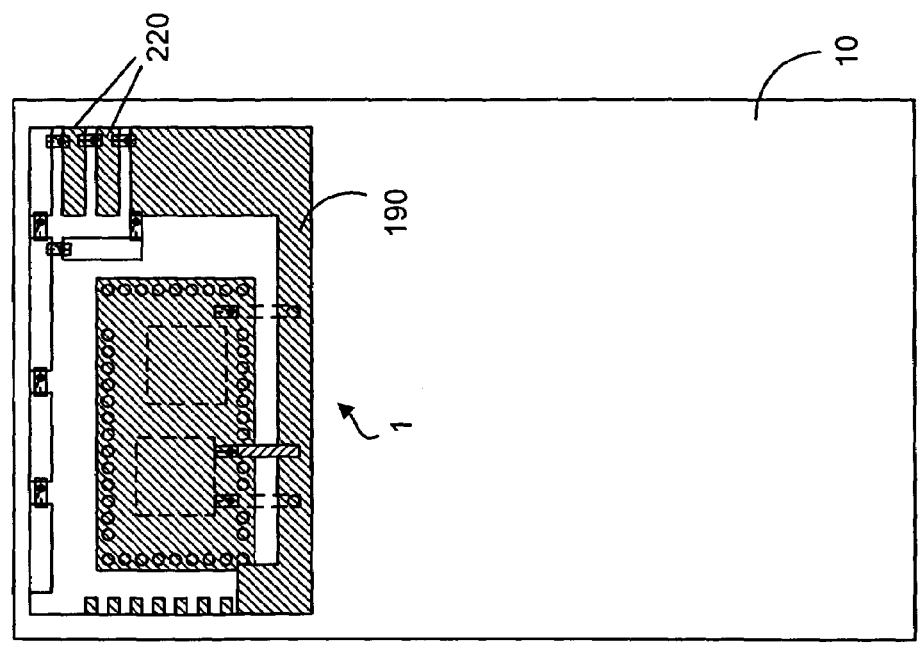

FIGS. 5a and 5b show the adjustment of the antenna frequencies when the same integrated antenna/front-end module is used in different products. For example, the shape, the size and the material of the mother boards 10 and 10' in two products are different. As such, the resonance characteristics of the antenna may change.

Figure 6:
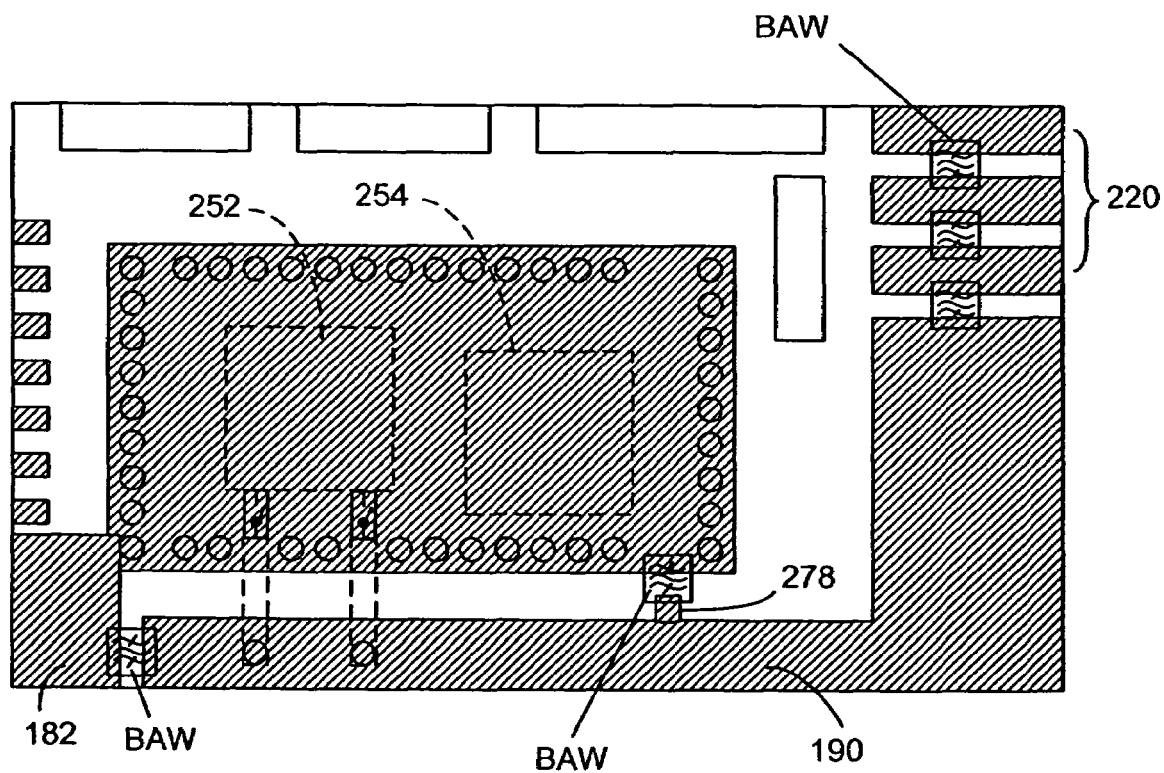
FIG. 6 is a schematic representation illustrating the integration of bulk acoustic wave filters with the adjustable antenna, according to the present invention.

It is possible to dispose one or more bulk acoustic wave (BAW) filters in the laminated structure 100 to carry out various functions. For example, one or more BAW filters can be used to connect the electrically conductive segments 220 to the resonator element 190 in order to synthesize the frequency response of the antenna, as shown in FIG. 6. The BAW filter can be placed in the ground tap 182 of the antenna, instead of being placed in a transmit path or receive path in the RF front-end. Furthermore, one or more BAWs can be used to prevent harmonic frequencies to radiate. For example, a BAW is placed at a point 278 where the third harmonic frequency has a maximum voltage value to provide an electrical connection between the resonator element 190 and the ground.

The BAWs and the switches (SW) can be embedded in the laminated structure, similar to the embedded chips 252, 254. As such, the integrated module 1 can be made very thin. In general, with the core layer 130 and a few build-up layers, an integrated module with an antenna can be made thinner than 1 mm. The BAWs can also be mounted on the surfaces of the laminated structure.

Figure 7:
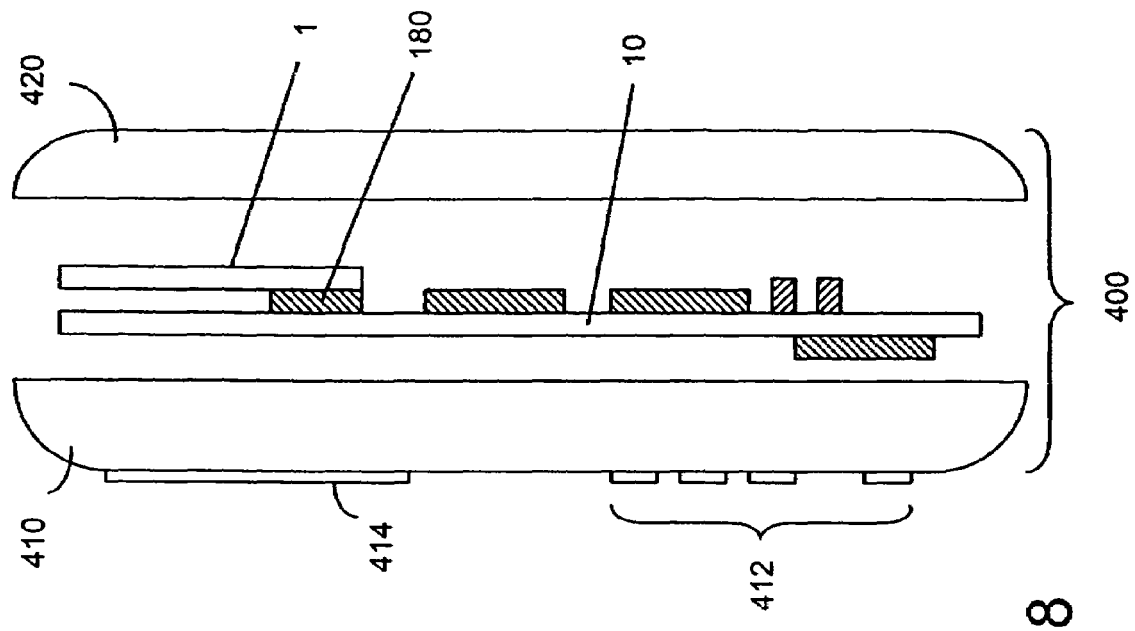
FIG. 7 is a schematic representation illustrating more electronic components on the mother board.
Figure 8:
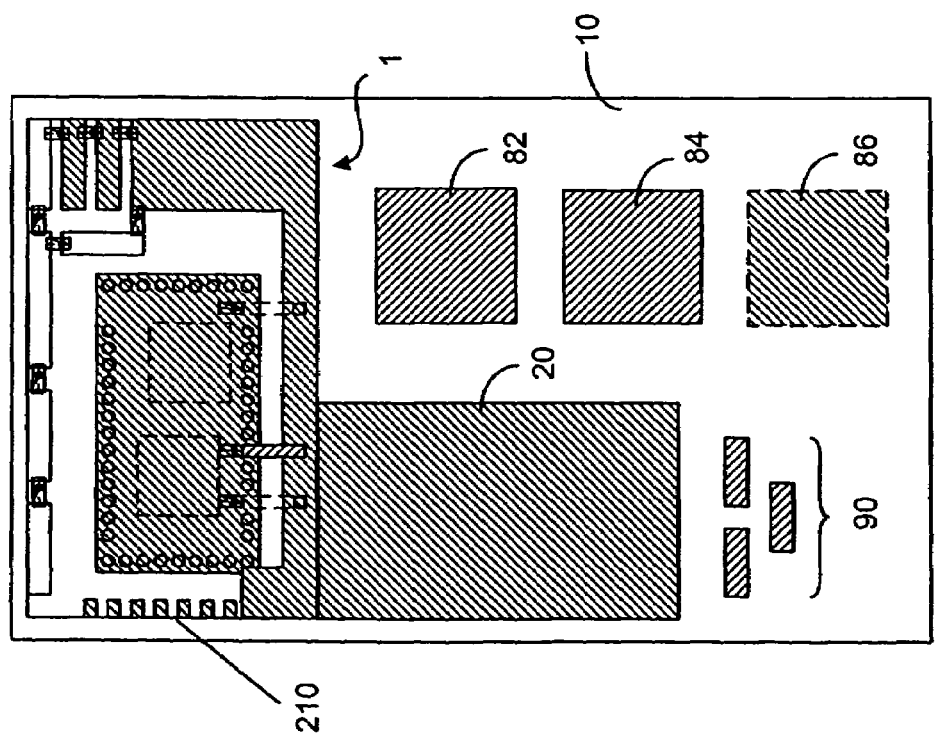
FIG. 8 is a schematic representation illustrating an electronic device having an integrated antenna RF front-end module, according to the present invention.

As shown in FIGS. 2a and 2b, the integrated module 1 is mounted on a mother board 10 with a ground connection 180 connecting the antenna and the ground plane 20 of the mother board. The mother board generally has many other electronic components 82, 84, 86, 90 disposed thereon, as shown in FIG. 7. These components can be mounted on one side or both sides of the mother board. For example, the electronic components on the mother board may include a processor for providing baseband data to the RF front-end module 1 through the connection pads 210. The mother board 10 and the integrated module 1 of the present invention can be used in an electronic device, such as a mobile phone, a communicator device or the like. As shown in FIG. 8, the electronic device 400 comprises a front housing part 410 and a rear housing part 420. The front housing part 410 has a keypad with a plurality of keys 412 to allow a user to activate a communications function using RF signals, for example. The front housing part 410 also has a display 414 for display information related to the communication function, for example.

Figures 9A, 9B:
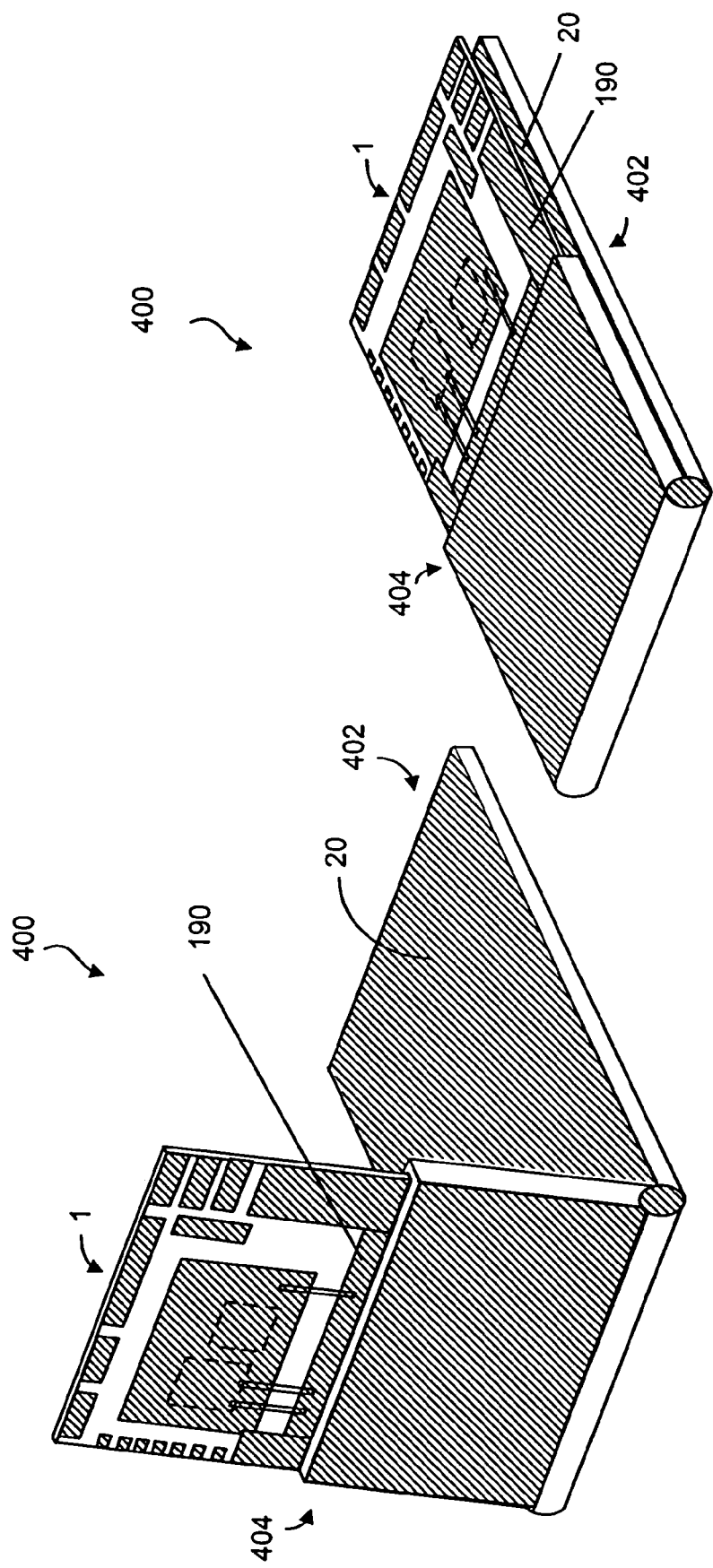
FIG. 9a is a schematic representation illustrating a clamshell phone in an open position.
FIG. 9b is a schematic representation illustrating a clamshell phone in a closed position.

In an electronic device 400, such as a clam-shell phone as shown in FIGS. 9a and 9b, two or more parts are used to implement the device components. As shown, the device 400 has a first wing 402 and a second wing 404. While the mother board (not shown) may be implemented in the first wing 402, the integrated front-end module 1 is disposed in the second wing 404. The ground for the antenna 190 may be in the first wing 402. The ground-antenna configuration changes depending upon whether the phone is in an open position (FIG. 9a) or in a closed position (FIG. 9b). In FIG. 9b, the antenna is closer to the ground than the configuration as shown in FIG. 9a. In such a device, the tunability is a key feature that makes the antenna work in both situations.

In sum, the present invention uses PWB or FR4 technology to provide a method to integrate an adjustable antenna and an RF-front end module in a laminated structure. The laminated-chips technology enables the integration of switchable, tunable and filtering components with the antenna in the same assembly process, where the RF front-end is built.

The core layer in the laminated structure can be used to bury chips, BAWs, switches and other electronic components. Electrically conductive segments in one or both of the surfaces of the laminated structure can be used to provide: EMC shielding for the embedded chips, resonating elements for the antenna, adjustment and tuning elements for the antenna, band selection of the RF front-end module and the electrical connections between RF and baseband of the RF front-end module. The shielding of the RF front-end can be implemented inherently with the laminated-chips technology. The shielding is especially important when the RF front-end is in the close proximity of the antenna. The feedback from the antenna to the RF front-end through electric and magnetic coupling needs to be prevented. Microvias through various layers and electrical conductors between layers can be used to provide electrical connections between the embedded electronics and the antenna, and between the embedded electronics and the baseband connection pads. As such, the RF signal connections between the antenna and the RF front-end can be provided by the solid printed copper wires on the PWB or the patterned copper foils on the FR4 materials. This type of electrical connection improves the reliability of implementation over the conventional method of spring-type touch connectors. Similar electrically conductive connectors through the laminated structure can be used to connect the resonator elements on both surfaces of the laminated structure.

As switchable and tunable circuit elements are provided on the same physical carrier as the resonator elements of the antenna, no additional electrical contacts between the integrated module and the mother board are needed. Similarly, as the feeding points between the antenna and the RF electronics are disposed in the same physical carrier, additional electrical contacts between the antenna and the mother board for feeding purposes can be eliminated. This integration not only reduces the loss of RF-power, but also reduces the cost of manufacturing. The interconnection between the mother board and the integrated RF front-end module, according to the present invention, can be achieved by a row connector or a ribbon cable, for example. Row connectors and ribbon cables are known in the art.

With the integrated module, the antenna can be tuned according to the operation environment. For example, when the user's hand changes the matching and the resonance frequency of the antenna, the changes can be compensated for by changing the length of the antenna by connecting one or more electrically conductive segments to the resonating element using one or more switches. Different antenna feed points can be used to select between different RF systems/frequency bands.

The various switches (SW) implemented in the integrated module can be solid-state components, such as CMOS, or MEMS switches. It is possible to include in the integrated RF-front end module various components such as: parallel transceivers for different radio systems, filters, linear amplifiers (LNAs), matching circuits, power amplifiers, RF-ASICs and so forth. Furthermore, it is possible to fit the baseband circuits in the integrated RF-module, according to the present invention.

Thus, although the invention has been described with respect to one or more embodiments thereof, it will be understood by those skilled in the art that the foregoing and various other changes, omissions and deviations in the form and detail thereof may be made without departing from the scope of this invention.

What is claimed is:

1. An integrated radio frequency front-end module for use in an electronic device, said radio frequency front-end module comprising:
   a physical carrier having a first surface and an opposing second surface;
   an antenna for transmitting and receiving radio frequency communication signals, the antenna having at least one radiating element disposed on at least one of the first and second surfaces of the physical carrier;
   radio frequency electronic components disposed in the physical carrier; and
   electrically conductive connectors disposed in the physical carrier for providing electrical connections between the antenna and the radio frequency electronic components, wherein the antenna has an operational frequency range, said module further comprising:
   one or more electrically conductive segments disposed on at least one of the first and second surfaces of the physical carrier in relation to said at least one radiating element; and one or more switching elements for selectively connecting said one or more electrically conductive segments and said at least one radiating element for changing the operational frequency range.

2. The module of claim 1, wherein the physical carrier comprises a laminated structure and wherein the radio frequency components are embedded in the laminated structure, said module further comprising:
   at least one electrically conductive layer disposed on the laminated structure substantially over the embedded radio frequency components for shielding the radio frequency components against electromagnetic interference.

3. The module of claim 1, further comprising:
   one or more electrically conductive segments disposed on at least one of the first and second surfaces of the physical carrier in relation to said at least one radiating element; and
   one or more switching elements for selectively connecting said one or more electrically conductive segments and said at least one radiating element for tuning the antenna.

4. The module of claim 2, wherein the laminated structure comprises a plurality of layers and wherein at least one of the layers is a printed wire board.

5. The module of claim 3, wherein the switching elements comprise one or more MEM switches.

6. The module of claim 3, wherein the switching elements comprise one or more CMOS switches.

7. The module of claim 1, further comprising a plurality of feed points associated with different locations of the antenna, wherein the feed points are selectable for impedance match tuning.

8. The module of claim 1, further comprising one or more acoustic-wave filters operatively connected to the antenna for preventing harmonic frequencies associated with the antenna from radiating.

9. The module of claim 1, further comprising one or more acoustic-wave filters operatively connected to the antenna for synthesizing a frequency response of the antenna.

10. A method, comprising:
    providing a physical carrier in a radio frequency front-end module, the physical carrier having a first surface and an opposing second surface;
    disposing a radiating element of an antenna on at least one of the first and second surfaces for transmitting and receiving radio-frequency communication signals, wherein the antenna has an operational frequency range;
    disposing radio frequency electronic components in the physical carrier;
    electrically connecting the electronic components and the antenna with electrically conducting connectors in the physical carrier; and
    disposing one or more electrically conductive segments on at least one of the first and second surfaces of the physical carrier in relation to said radiating element, and one or more switching elements for selectively connecting said one or more electrically conductive segments and said radiating element for changing the operational frequency range.

11. The method of claim 10, wherein the physical carrier comprises a laminated structure for embedding the radio frequency electronic components, said method further comprising:
    shielding the radio frequency components against electromagnetic interference with at least one electrically conductive layer disposed on the laminated structure substantially over the embedded radio frequency components.

12. A communications device operating in radio frequencies, comprising:
    a housing; and
    an integrated radio frequency front-end module, the module comprising:
       a physical carrier having a first surface and an opposing second surface;
       an antenna for transmitting and receiving radio frequency communication signals. in an operational frequency range, the antenna having at least one radiating element disposed on at least one of the first and second surfaces of the physical carrier;
       radio frequency electronic components disposed in the physical carrier;
       electrically conductive connectors disposed in the physical carrier for providing electrical connections between the antenna and the RF electronic components, and
       one or more electrically conductive segments disposed on at least one of the first and second surfaces of the physical carrier in relation to said at least one radiating element; and
       one or more switching elements for selectively connecting said one or more electrically conductive segments and said at least one radiating element for changing the operational frequency range.

13. The communications device of claim 12, wherein the physical carrier comprises a laminated structure for embedding the radio frequency components and wherein the integrated radio frequency front-end module further comprises:
    at least one electrically conductive layer disposed on the laminated structure substantially over the embedded radio frequency components for shielding the radio frequency components against electromagnetic interference.

14. The communications device of claim 12, wherein the radio frequency front-end module further comprises:
    one or more electrically conductive segments disposed on at least one of the first and second surfaces of the physical carrier in relation to said at least one radiating element; and one or more switching elements for selectively connecting said one or more electrically conductive segments and said at least one radiating element for tuning the antenna.

15. The communications device of claim 12, comprising a mobile terminal.

16. An integrated radio frequency front-end module for use in an electronic device, said radio frequency front-end module comprising:

a physical carrier having a first surface and an opposing second surface;

an antenna for transmitting and receiving radio frequency communication signals, the antenna having at least one radiating element disposed on at least one of the first and second surfaces of the physical carrier;

radio frequency electronic components disposed in the physical carrier; and electrically conductive connectors disposed in the physical carrier for providing electrical connections between the antenna and the radio frequency electronic components wherein the electric device is a multiband, multimode telephone operable in different operation modes, said module further comprising a plurality of feed points associated with different locations of the antenna, and wherein the feed points are selectable to suite the operation mode.

* * * * *